United States Patent
Lin et al.

(10) Patent No.: US 12,308,807 B2
(45) Date of Patent: May 20, 2025

(54) AMPLIFICATION CIRCUIT WITH COMPENSATION FOR COMMON-MODE VOLTAGE FLUCTUATION

(71) Applicant: MEDIATEK INC., Hsinchu (TW)

(72) Inventors: Yu-Hsin Lin, Hsinchu (TW);
Fong-Wen Lee, Hsinchu (TW);
Wen-Chieh Wang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 721 days.

(21) Appl. No.: 17/542,675

(22) Filed: Dec. 6, 2021

(65) Prior Publication Data
US 2022/0255516 A1 Aug. 11, 2022

Related U.S. Application Data

(60) Provisional application No. 63/146,011, filed on Feb. 5, 2021.

(51) Int. Cl.
*H03F 3/217* (2006.01)
*H03F 3/45* (2006.01)

(52) U.S. Cl.
CPC ... *H03F 3/45475* (2013.01); *H03F 2200/165* (2013.01)

(58) Field of Classification Search
CPC .......... H03F 3/45475; H03F 2200/165; H03F 2200/351; H03F 2203/45401; H03F 2203/45408; H03F 2203/45438; H03F 3/45179; H03F 3/45636; H03F 3/2173; H03F 3/2171

USPC .......................................................... 330/251
See application file for complete search history.

(56) References Cited

U.S. PATENT DOCUMENTS

| 9,525,385 | B2 | 12/2016 | Lin |
| 2011/0169569 | A1 | 7/2011 | Liu |
| 2015/0229274 | A1 | 8/2015 | Cho et al. |
| 2018/0062583 | A1 | 3/2018 | Zhao et al. |

OTHER PUBLICATIONS

Extended European Search Report dated May 27, 2022, issued in application No. EP 21214197.2.
Kwon, S., et al.; "A 0.028% THD+N, 91% power-efficiency, 3-level PWM Class-D amplifier with a true differential front-end;" ISSCC 2012 / Session 5 / Audio and Power Converters / 5.3; Feb. 2012; pp. 96-98.
Chinese language office action dated Sep. 5, 2022, issued in application No. TW 111103798.

*Primary Examiner* — Andrea Lindgren Baltzell
*Assistant Examiner* — Khiem D Nguyen
(74) *Attorney, Agent, or Firm* — McClure, Qualey & Rodack, LLP

(57) ABSTRACT

An amplification circuit with a common-mode voltage compensation circuit is shown. The common-mode voltage compensation circuit has a first compensation resistor coupled between an input terminal of a loop filter of the amplification circuit and a control node, and a second compensation resistor coupled between another input terminal of the loop filter and the control node. The control node is coupled to a power ground voltage when the two output signals of the amplification circuit are high, and it is coupled to a power supply voltage when the two output signals of the amplification circuit are low.

13 Claims, 3 Drawing Sheets

AMPLIFICATION CIRCUIT WITH COMPENSATION FOR COMMON-MODE VOLTAGE FLUCTUATION

CROSS REFERENCE TO RELATED APPLICATIONS

This application claims the benefit of U.S. Provisional Application No. 63/146,011, filed Feb. 5, 2021, the entirety of which is incorporated by reference herein.

BACKGROUND OF THE INVENTION

Field of the Invention

The present invention relates to an amplification circuit.

Description of the Related Art

A class-D amplifier is also known as a switching amplifier or a pulse width modulation (PWM) amplifier. By PWM control, the metal-oxide-silicon (MOS) transistors of the power driver of the class-D amplifier are either fully on or fully off, significantly reducing power loss. High-efficiency amplification is achieved.

There are several ways to convert analog signals to PWM signals to drive the MOSs of the power driver. To eliminate an output filter, a BD modulation switching technique has been developed. According to the BD modulation switching technique, the duty cycle of the difference between two output signals VOP and VON of the class-D amplifier is modulated to make the average content of the amplified result correspond to the analog input signal. The class-D amplifier is a closed-loop circuit. The larger the analog input signal, the more significant the difference of PWM width is between the two output signals.

However, the BD modulation switching technique may result in common-mode voltage fluctuation. FIG. 1 shows waveforms of the output signals VOP and VON and their common-mode voltage Out_CM. An ideal value of the common-mode voltage Out_CM is VDD/2. When both the output signals VOP and VON are low ('L', e.g., 0V), the common-mode voltage Out_CM is 0V. When both the output signals VOP and VON are high ('H', e.g., VDD), the common-mode voltage Out_CM is VDD. The common-mode voltage Out_CM fluctuates significantly (0V or VDD) rather than being kept at VDD/2. When fed back into a loop filter of a class-D amplifier, the common-mode voltage fluctuation degrades the gain of a differential operational amplifier within the loop filter.

A class-D amplifier without the phenomenon of common-mode voltage fluctuation is called for.

BRIEF SUMMARY OF THE INVENTION

An amplification circuit (e.g., a class-D amplifier using a PWM technique) that successfully eliminates the common-mode voltage fluctuation is proposed.

A amplification circuit in accordance with an exemplary embodiment of the present invention includes a loop filter, a pulse-width modulation signal generator, a gate driver, a power driver, a signal feedback circuit, and a common-mode voltage compensation circuit. The loop filter, the pulse-width modulation signal generator, the gate driver, the power driver, and the signal feedback circuit are configured to form a loop for signal amplification. The common-mode voltage compensation circuit provides a control node that is coupled to a first input terminal and a second input terminal of the loop filter. The common-mode voltage compensation circuit couples the control node to a power ground voltage when both a first output signal and a second output signal of the amplification circuit are high. The common-mode voltage compensation circuit couples the control node to a power supply voltage when both the first output signal and the second output signal of the amplification circuit are low.

In an exemplary embodiment, the loop filter has a differential operational amplifier. The first input terminal and the second input terminal of the loop filter are coupled to a pair of input terminals of the differential operational amplifier. The signal feedback circuit includes a first feedback resistor coupling the first output signal of the amplification circuit to the second input terminal of the loop filter, and a second feedback resistor coupling the second output signal of the amplification circuit to the first input terminal of the loop filter. The common-mode voltage compensation circuit includes a first compensation resistor coupled between the second input terminal of the loop filter and the control node, and a second compensation resistor coupled between the first input terminal of the loop filter and the control node.

The common-mode voltage compensation circuit may be a switching-type digital-to-analog converter, comprising a first switch controlled to couple the control node to the power supply voltage, and a second switch, controlled to couple the control node to the power ground voltage.

Unlike the use of an active component, the switching-type digital-to-analog converter saves power.

Furthermore, the signal feedback is not affected by common-mode voltage compensation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
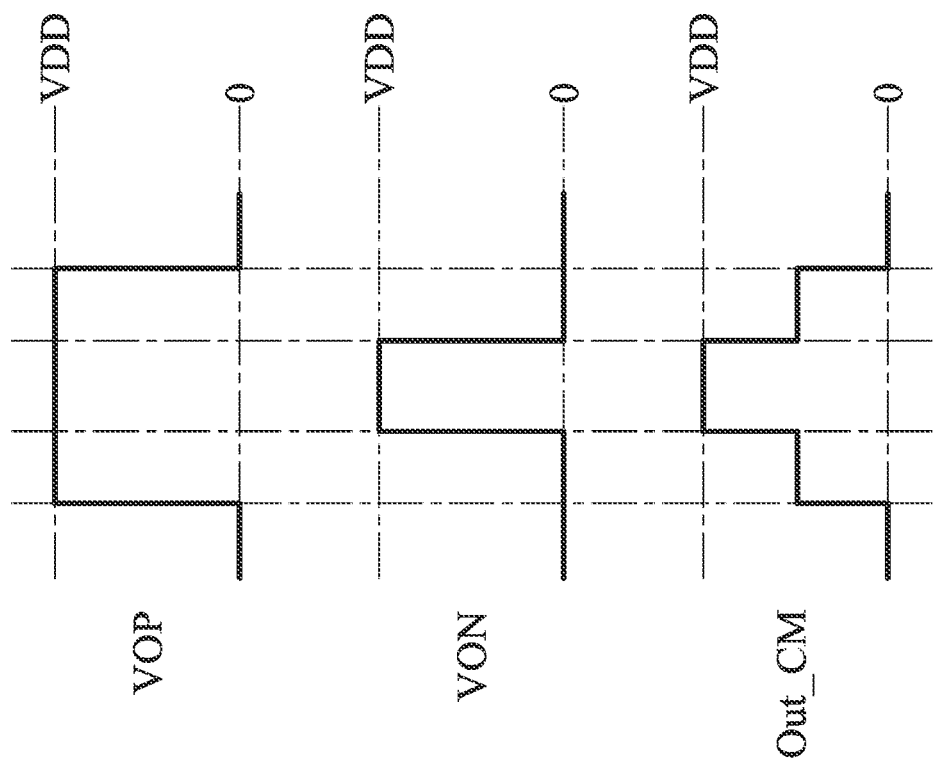
FIG. 1 shows waveforms of the output signals VOP and VON and their common-mode voltage Out_CM.
Figure 2:
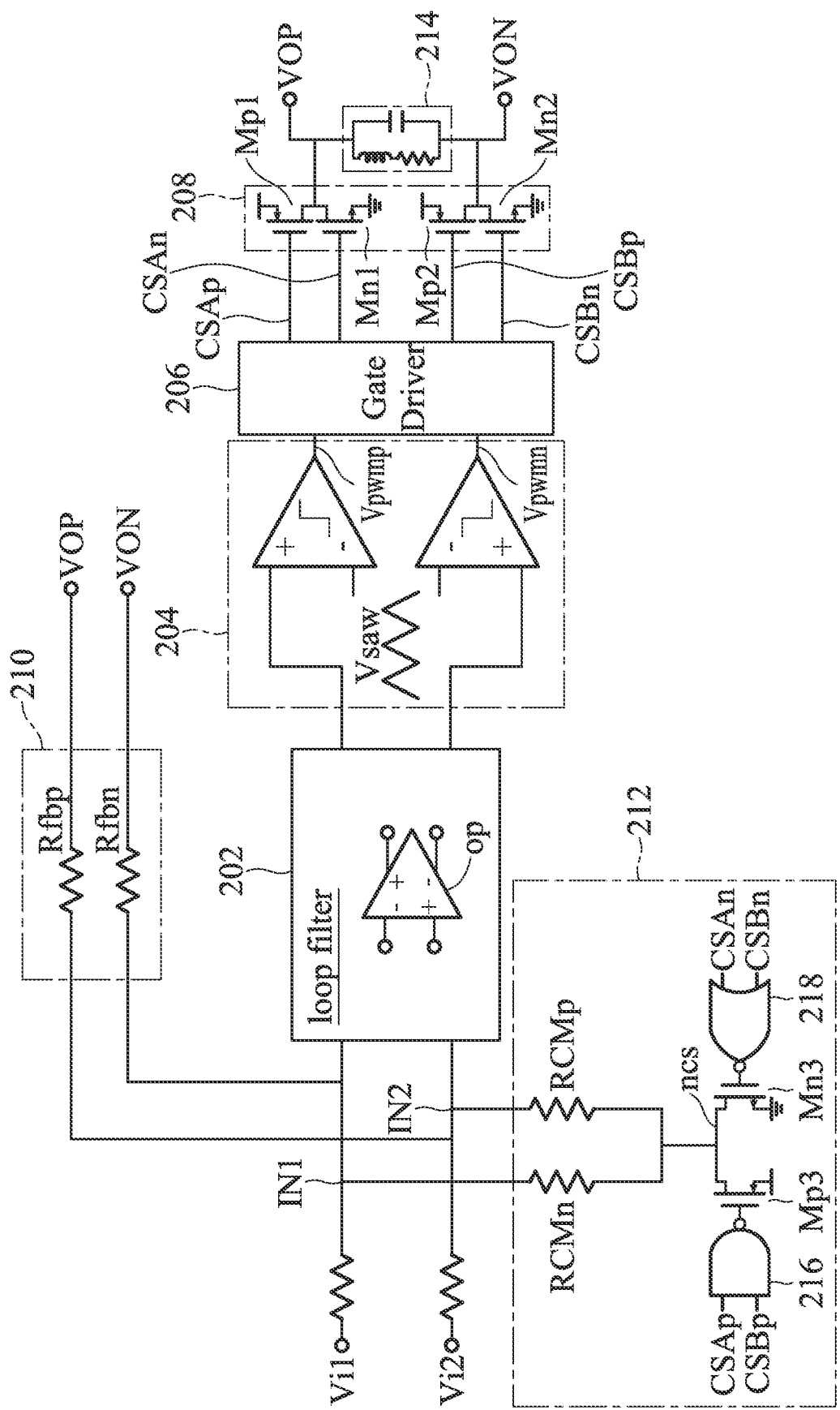
FIG. 2 depicts an amplification circuit in accordance with an exemplary embodiment of the present invention.

FIG. 2 depicts an amplification circuit in a differential-in and differential-out architecture in accordance with an exemplary embodiment of the present invention. The amplification circuit includes a loop filter 202, a pulse-width modulation (PWM) signal generator 204, a gate driver 206, a power driver 208, a signal feedback circuit 210, and a common-mode voltage compensation circuit 212. The loop filter 202, PWM signal generator 204, gate driver 206, power driver 208, and signal feedback circuit 210 are configured to form a loop for signal amplification. The common-mode voltage compensation circuit 212 is designed to compensate for common-mode voltage fluctuation.

As shown, a differential input pair (Vi1, Vi2) received by the amplification circuit is coupled to the loop filter 202. The loop filter 202 is coupled to the PWM signal generator 204. The PWM signal generator 204 generates PWM signals Vpwmp and Vpwmn by comparing the signals received from the loop filter 202 with a saw signal Vsaw. The gate driver 206 transforms the PWM signals Vpwmp and Vpwmn into control signals CSAp, CSAn, CSBp, and CSBn. The power driver 208 includes an H-bridge circuit controlled by the control signals CSAp, CSAn, CSBp, and CSBn to generate output signals VOP and VON to drive a load 214. The output signals VOP and VON are fed back to the loop filter 202 through the signal feedback circuit 210. The common-mode voltage compensation circuit 212 is provided to compensate for the fluctuation of a common-mode voltage Out_CM of the output signals VOP and VON.

The loop filter 202 includes a differential operational amplifier op. The loop filter 202 has two input terminals IN1 and IN2, which are coupled to a pair of input terminals of the differential operational amplifier op within the loop filter 202. A stable common-mode voltage is required at the two input terminal IN1 and IN2.

In the exemplary embodiment shown in FIG. 2, the signal feedback circuit 210 includes a feedback resistor Rfbp coupling the output signal VOP to the input terminal IN2 of the loop filter 202, and a feedback resistor Rfbn coupling the output signal VON to the input terminal IN1 of the loop filter 202. The common-mode voltage compensation circuit 212 has a compensation resistor RCMp coupled between the input terminal IN2 of the loop filter 202 and a control node ncs, and a compensation resistor RCMn coupled between the input terminal IN1 of the loop filter 202 and the control node ncs. The common-mode voltage compensation circuit 212 is a switching-type DAC (digital-to-analog converter). In addition to the resistors RCMp and RCMn, the common-mode voltage compensation circuit 212 includes a switching design and a logic circuit controlling the switching design. When both the output signals VOP and VON are high, the switching design is controlled to couple the control node ncs to a power ground voltage (GND). When both the output signals VOP and VON are low, the switching design is controlled to couple the control node ncs to a power supply voltage (VDD). In these situations, the feedback resistor Rfbp is combined with the compensation resistor RCMp and the feedback resistor Rfbn is combined with the compensation resistor RCMn; two voltage dividers are established. Through the two voltage dividers, the two input terminals IN1 and IN2 coupled to the pair of input terminals of the differential operational amplifier op are biased at the same stable direct current voltage level. The common-mode voltage fluctuation is suppressed.

The structure of the power driver 208 is described in this paragraph. The power driver 208 has p-channel metal-oxide-silicon (PMOS) transistors Mp1 and Mp2, and n-channel metal-oxide-silicon (NMOS) transistors Mn1 and Mn2. The PMOS transistor Mp1 is controlled by the control signal CSAp to pull up the output signal VOP to the power supply voltage VDD. The NMOS transistor Mn1 is controlled by the control signal CSAn to pull down the output signal VOP to the power ground voltage GND. The PMOS transistor Mp2 is controlled by the control signal CSBp to pull up the output signal VON to the power supply voltage VDD. The NMOS transistor Mn2 is controlled by the control signal CSBn to pull down the output signal VON to the power ground voltage GND. The control signals CSAp, CSAn, CSBp, and CSBn are further used to switch the switching design of the common-mode voltage compensation circuit 212.

The common-mode voltage compensation circuit 212 uses a PMOS transistor Mp3 and an NMOS transistor Mn3 in the switching design. When the output signals VOP and VON are both high, the switch implemented by the PMOS transistor Mp3 is open, and the switch implemented by the NMOS transistor Mn3 is close. The control node ncs is coupled to the power ground voltage VGG. The high voltage level of the output signal VOP is divided by the resistors Rfbp and RCMp. A stable DC voltage level RCMp/(Rfbp+RCMp) is supplied to the input terminal IN2 of the loop filter 202. Similarly, the high voltage level of the output signal VON is divided by the resistors Rfbn and RCMn. A stable DC voltage level RCMn/(Rfbn+RCMn) is supplied to the input terminal IN1 of the loop filter 202. In an exemplary embodiment, the switches Mp3 and Mn3 are opened or closed in accordance with the control signals CSAp, CSAn, CSBp, and CSBn generated by the gate driver 206.

In FIG. 2, a logic circuit including a NAND gate 216 and a NOR gate 218 is provided to control the switches Mp3 and Mn3, respectively. The NAND gate 216 has two input terminals receiving the control signals CSAp and CSBp, and an output terminal coupled to a gate terminal of the PMOS Mp3. The NOR gate 218 has two input terminals receiving the control signals CSAn and CSBn, and an output terminal coupled to a gate terminal of the NMOS Mn3. When the output signals VOP and VON are both high (VDD), it means that the control signals CSAp and CSBp are low to turn on the PMOS transistors Mp1 and Mp2, and the control signals CSAn and CSBn are low to turn off the NMOS transistors Mn1 and Mn2. In response to the control signals CSAp and CSBp which are low, the NAND gate 216 outputs a high signal and the switch Mp3 is open. In response to the control signals CSAn and CSAn which are low, the NOR gate 218 output a high signal and the switch Mn3 is close. The control node ncs is coupled to the power ground voltage through the switch Mn3. The resistors Rfbp and RCMp form a voltage divider between VOP (H) and the grounded control node ncs. The input terminal IN2 of the loop filter 202 is biased at a stable voltage level RCMp/(RCMp+Rfbp). When RCMp is equal to Rfbp, the input terminal IN2 of the loop filter 202 is biased at VDD//2. The resistors Rfbn and RCMn form another voltage divider between VON (H) and the grounded control node ncs. The input terminal IN1 of the loop filter 202 is biased at a stable voltage level RCMn/(RCMn+Rfbn). When RCMn is equal to Rfbn, the input terminal IN1 of the loop filter 202 is biased at VDD//2. In such a design, the common mode voltage is kept at the ideal value VDD/2. The common-mode voltage fluctuation is successfully suppressed.

In comparison with active components, the switching-type DAC implementing the common-mode voltage compensation circuit 212 saves power.

Furthermore, the common-mode voltage compensation circuit 212 does not affect the feedback of the output signals VOP and VON. No matter the common-mode voltage compensation circuit 212 is turned on or not, the output signals VOP and VON is feedback the loop filter 202 as usual.

In an exemplary embodiment, the resistance ratio between the feedback resistor Rfbp and the compensation resistor RCMp is equal to the resistance ratio between the feedback resistor Rfbn and the compensation resistor RCMn.

In an exemplary embodiment, the resistors Rfbp, Rfbn, RCMp, and RCMn have the same resistance.

In an exemplary embodiment, the input terminal IN1 of the loop filter 202 is coupled to the positive input terminal "+" of the differential operational amplifier op, and the input terminal IN2 of the loop filter 202 is coupled to the negative input terminal "−" of the differential operational amplifier op.

In an exemplary embodiment, the input terminal IN1 of the loop filter 202 is coupled to the negative input terminal "−" of the differential operational amplifier op, and the input terminal IN2 of the loop filter 202 is coupled to the positive input terminal "+" of the differential operational amplifier op.

Figure 3:
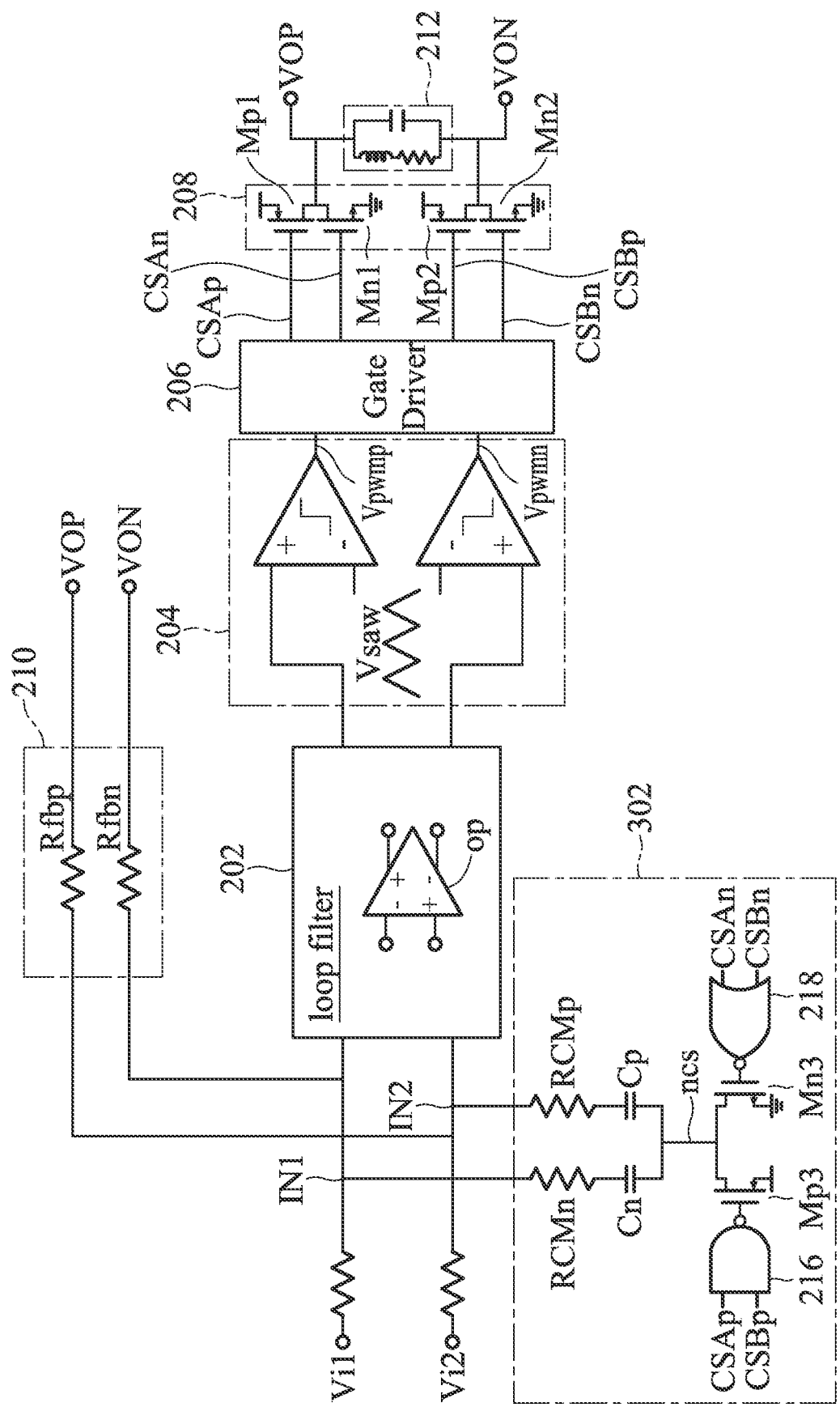
FIG. 3 depicts an amplification circuit in accordance with another exemplary embodiment of the present invention.

FIG. 3 depicts an amplification circuit in accordance with another exemplary embodiment of the present invention. In comparison with the common-mode voltage compensation circuit 212 of FIG. 2, the common-mode voltage compensation circuit 302 shown in FIG. 3 further includes two capacitors Cp and Cn. The capacitor Cp is coupled between the input terminal IN2 of the loop filter 202 and the control node ncs in series with the compensation resistor RCMp. The capacitor Cn is coupled between the input terminal IN1 of the loop filter 202 and the control node ncs in series with the compensation resistor RCMn. The in-band noise of the common-mode voltage compensation circuit 302 can be filtered by the capacitors Cp and Cn.

In some exemplary embodiments, the logic circuit to open or close the switches Mp3 and Mn3 may have some modifications. Any logic circuit that closes the switch Mp3 when the output signal VOP and VON are both low and closes the switch Mn3 when the output signal VOP and VON are both high should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplification circuit, comprising:
a loop filter, a pulse-width modulation signal generator, a gate driver, a power driver, and a signal feedback circuit, configured to form a loop for signal amplification; and
a common-mode voltage compensation circuit, providing a control node that is coupled to a first input terminal and a second input terminal of the loop filter,
wherein:
the power driver comprises:
a first p-channel metal-oxide-silicon transistor, controlled by a first control signal generated by the gate driver to couple a first output terminal of the amplification circuit to a power supply voltage to pull up a first output signal of the amplification circuit;
a first n-channel metal-oxide-silicon transistor, controlled by a second control signal generated by the gate driver to couple the first output terminal of the amplification circuit to a power ground voltage to pull down the first output signal of the amplification circuit;
a second p-channel metal-oxide-silicon transistor, controlled by a third control signal generated by the gate driver to couple a second output terminal of the amplification circuit to the power supply voltage to pull up a second output signal of the amplification circuit; and
a second n-channel metal-oxide-silicon transistor, controlled by a fourth control signal generated by the gate driver to couple the second output terminal of the amplification circuit to the power ground voltage to pull down the second output signal of the amplification circuit; and
the common-mode voltage compensation circuit is controlled by the first control signal, the second control signal, the third control signal, and the fourth control signal, to couple the control node to a power ground voltage when both first output signal and a second output signal of the amplification circuit are high, and to couple the control node to a power supply voltage when both the first output signal and the second output signal of the amplification circuit are low.

2. The amplification circuit as claimed in claim 1, wherein:
the loop filter has a differential operational amplifier, and the first input terminal and the second input terminal of the loop filter are coupled to a pair of input terminals of the differential operational amplifier;
the signal feedback circuit includes a first feedback resistor coupling the first output signal of the amplification circuit to the second input terminal of the loop filter, and a second feedback resistor coupling the second output signal of the amplification circuit to the first input terminal of the loop filter;
the common-mode voltage compensation circuit includes a first compensation resistor coupled between the second input terminal of the loop filter and the control node, and a second compensation resistor coupled between the first input terminal of the loop filter and the control node.

3. The amplification circuit as claimed in claim 2, wherein the common-mode voltage compensation circuit is a switching-type digital-to-analog converter, and further comprises;
a first switch, controlled to couple the control node to the power supply voltage; and
a second switch, controlled to couple the control node to the power ground voltage.

4. The amplification circuit as claimed in claim 3, wherein:
the first switch is controlled by the first control signal and the third control signal; and
the second switch is controlled by the second control signal and the fourth control signal.

5. The amplification circuit as claimed in claim 4, wherein:
the first switch is a third p-channel metal-oxide-silicon transistor, having a source terminal coupled to the power supply voltage and a drain terminal coupled to the control node; and
the second switch is a third n-channel metal-oxide-silicon transistor, having a source terminal coupled to the power ground voltage and a drain terminal coupled to the control node.

6. The amplification circuit as claimed in claim 5, wherein the common-mode voltage compensation circuit further comprises:
a NAND gate, receiving the first control signal and the third control signal, and having an output terminal coupled to a gate terminal of the third p-channel metal-oxide-silicon transistor; and
a NOR gate, receiving the second control signal and the fourth control signal, and having an output terminal coupled to a gate terminal of the third n-channel metal-oxide-silicon transistor.

7. The amplification circuit as claimed in claim 2, wherein the common-mode voltage compensation circuit further comprises:
- a first capacitor, coupled between the second input terminal of the loop filter and the control node in series with the first compensation resistor; and
- a second capacitor, coupled between the first input terminal of the loop filter and the control node in series with the second compensation resistor.

8. The amplification circuit as claimed in claim 2, wherein:
- a resistance ratio between the first feedback resistor and the first compensation resistor is equal to a resistance ratio between the second feedback resistor and the second compensation resistor.

9. The amplification circuit as claimed in claim 2, wherein:
- the first feedback resistor and the first compensation resistor have the same resistance; and
- the second feedback resistor and the second compensation resistor have the same resistance.

10. The amplification circuit as claimed in claim 2, wherein:
- the first feedback resistor, the second feedback resistor, the first compensation resistor, and the second compensation resistor have the same resistance.

11. The amplification circuit as claimed in claim 2, wherein:
- the amplification circuit uses the first output signal and the second output signal as a positive output signal and a negative output signal, respectively, to drive a load; and
- the differential operational amplifier within the loop filter has a positive input terminal and a negative input terminal, the first input terminal of the loop filter is coupled to the positive input terminal of the differential operational amplifier, and the second input terminal of the loop filter is coupled to the negative input terminal of the differential operational amplifier.

12. The amplification circuit as claimed in claim 2, wherein:
- the amplification circuit uses the first output signal and the second output signal as a positive output signal and a negative output signal, respectively, to drive a load; and
- the differential operational amplifier within the loop filter has a positive input terminal and a negative input terminal, the first input terminal of the loop filter is coupled to the negative input terminal of the differential operational amplifier, and the second input terminal of the loop filter is coupled to the positive input terminal of the differential operational amplifier.

13. The amplification circuit as claimed in claim 1 is a class-D amplifier.

* * * * *